(12) United States Patent
Jiang et al.

(10) Patent No.: US 11,575,248 B2
(45) Date of Patent: Feb. 7, 2023

(54) SOLID STATE PREFABRICATED SUBSTATION

(71) Applicant: ABB Schweiz AG, Baden (CH)

(72) Inventors: Taosha Jiang, Cary, NC (US); Carlos David Nieto, Juri (EE); Debrup Das, Apex, NC (US); Daniel Turk, Tallinn (EE)

(73) Assignee: ABB SCHWEIZ AG, Baden (CH)

( * ) Notice: Subject to any disclaimer, the term of this patent is extended or adjusted under 35 U.S.C. 154(b) by 489 days.

(21) Appl. No.: 16/731,264

(22) Filed: Dec. 31, 2019

(65) Prior Publication Data

US 2021/0203139 A1 Jul. 1, 2021

(51) Int. Cl.

| | | |
|---|---|---|
| *H02B 7/08* | (2006.01) |
| *H02B 1/56* | (2006.01) |
| *H02H 7/22* | (2006.01) |
| *H01F 27/28* | (2006.01) |
| *H02B 1/20* | (2006.01) |
| *H01F 27/24* | (2006.01) |
| *H02B 1/26* | (2006.01) |

(52) U.S. Cl.
CPC .............. *H02B 7/08* (2013.01); *H01F 27/24* (2013.01); *H01F 27/28* (2013.01); *H02B 1/202* (2013.01); *H02B 1/26* (2013.01); *H02B 1/56* (2013.01); *H02H 7/22* (2013.01)

(58) Field of Classification Search
CPC .......... H01F 27/02; H01F 27/24; H01F 27/28; H01F 27/40; H02B 1/202; H02B 1/26; H02B 1/56; H02B 7/06; H02B 7/08; H02H 7/22; H03K 17/18

See application file for complete search history.

(56) References Cited

U.S. PATENT DOCUMENTS

| | | | | |
|---|---|---|---|---|
| 7,292,011 B2 * | 11/2007 | Beneditz | .............. | H02H 1/0015 322/39 |
| 7,405,910 B2 * | 7/2008 | Maitra | .................... | H01H 9/542 361/7 |
| 7,885,049 B2 * | 2/2011 | Crewson | .................. | H03K 3/57 361/98 |
| 7,989,984 B2 * | 8/2011 | Draper | ..................... | H02B 7/00 307/85 |
| 8,054,628 B2 * | 11/2011 | Carsten | .................... | H02B 7/06 361/603 |

(Continued)

FOREIGN PATENT DOCUMENTS

| | | |
|---|---|---|
| CN | 1238584 A | 12/1999 |
| CN | 104009537 A | 8/2014 |

(Continued)

OTHER PUBLICATIONS

MIDEL 7131 Thermal Properties, Sep. 2018, 1 page (Year: 2018).*

(Continued)

*Primary Examiner* — Robert J Hoffberg
(74) *Attorney, Agent, or Firm* — Greenberg Traurig, LLP

(57) ABSTRACT

A prefabricated substation is provided with a solid state breaker and a transformer. The substation preferably transforms voltage from a medium voltage to a low voltage. The substation also breaks current flow through the substation when a fault occurs. The primary components of the substation, including the transformer and solid state breaker, are located together within the housing.

23 Claims, 2 Drawing Sheets

(56) References Cited

U.S. PATENT DOCUMENTS

| | | | | |
|---|---|---|---|---|
| 8,068,320 | B2* | 11/2011 | Faulkner | H02B 7/06 |
| | | | | 361/620 |
| 8,279,571 | B2* | 10/2012 | Crewson | H03K 3/57 |
| | | | | 361/94 |
| 8,896,987 | B2* | 11/2014 | Kampfer | H02B 7/08 |
| | | | | 361/620 |
| 9,112,422 | B1 | 8/2015 | Vinciarelli | |
| 10,039,205 | B2* | 7/2018 | Aarskog | H02P 27/06 |
| 10,159,117 | B2* | 12/2018 | Ono | H05B 6/101 |
| 10,491,098 | B2* | 11/2019 | Chen | H02M 1/4208 |
| 2008/0288122 | A1 | 11/2008 | Thure et al. | |
| 2010/0084925 | A1 | 4/2010 | Draper et al. | |
| 2013/0044406 | A1 | 2/2013 | Kampfer et al. | |
| 2015/0115902 | A1* | 4/2015 | Panosyan | H02J 3/38 |
| | | | | 322/21 |
| 2015/0137771 | A1 | 5/2015 | Panosyan et al. | |
| 2015/0237680 | A1 | 8/2015 | Ono et al. | |
| 2017/0004948 | A1 | 1/2017 | Leyh | |
| 2017/0055358 | A1 | 2/2017 | Aarskog | |
| 2019/0280586 | A1 | 9/2019 | Chen et al. | |
| 2020/0266624 | A1* | 8/2020 | Zhou | H02H 9/025 |

FOREIGN PATENT DOCUMENTS

| | | | |
|---|---|---|---|
| CN | 204030390 U | 12/2014 | |
| WO | 2008113745 A1 | 9/2008 | |
| WO | WO-2008113745 A1 * | 9/2008 | H01F 27/10 |

OTHER PUBLICATIONS

Jin, H., "Dielectric Strength and Thermal Conductivity of Mineral Oil based Nanofluids," Dissertation, Apr. 2015, Retrieved Feb. 9, 2021, from: https://citeseerx.ist.psu.edu/viewdoc/download7doi=10.1.1.1003.3415&rep=rep1&type=pdf.

United States Patent & Trademark Office, the International Search Report and the Written Opinion Issued in corresponding International application No. PCT/US2020/066315, dated Mar. 3, 2021, 13 pp.

ABB Product Catalog, UniPack-S, Steel Compact Secondary Substation, "The UniPack-S provides a Sustainable, Flexible Solution with a State-of-the-art design", 1VPD110001A0409, Mar. 2019, 40pp.

M. Ebraham Adabi, et al., Aime Energy, vol. 6, Issue 2, 291-338, "Solid State Transformer Technologies and Applications: A Bibliographical Survey", http://www.aimspress.com/journal/energy, DOI: 10.3934/energy.2018.2.291, Published: Apr. 20, 2018, 48pp.

Georgi Kunov, "Matlab-Simulink Model of Solid-State Transformer Realized with Matrix Converters", 978-1-4799-5817-7/14, IEEE, Department of Power Electronics, Technical University of Sofia, 2014, 4pp.

IEC, IEC 62271-202, Edition 2.0, International Standard, High-voltage switchgear and controlgear—Part 202: High-voltage/low-voltage prefabricated substation, Mar. 2014, 194pp.

* cited by examiner

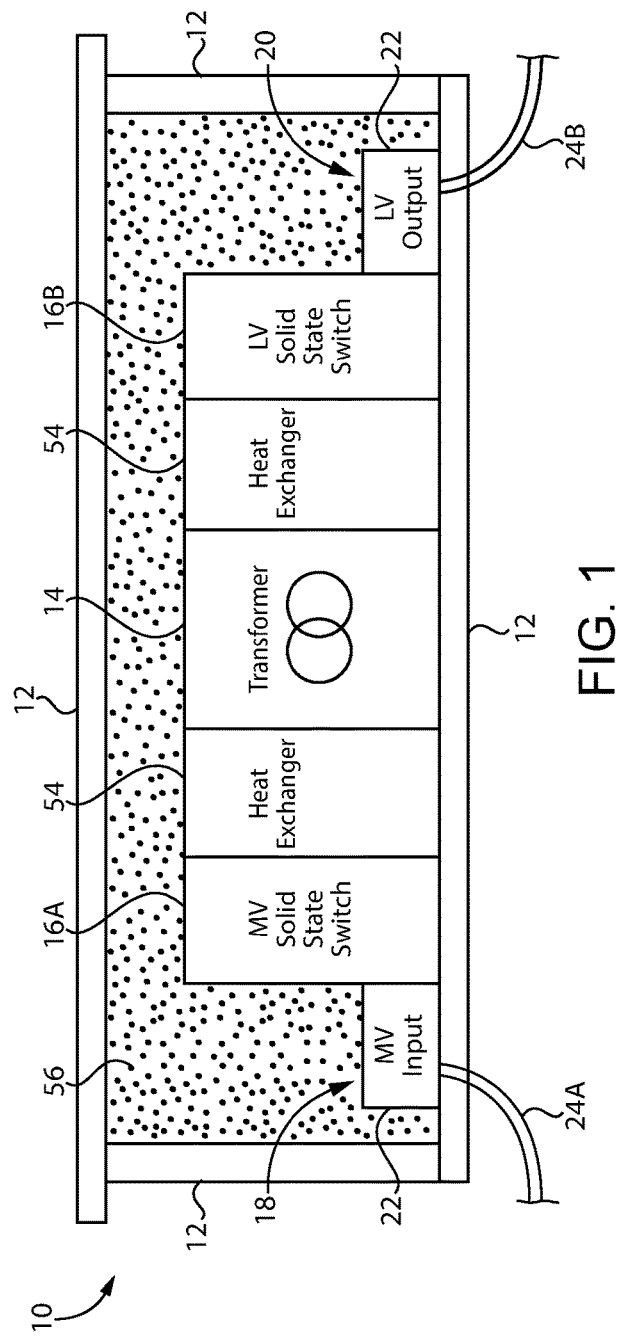
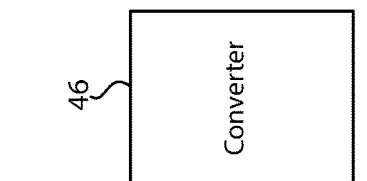
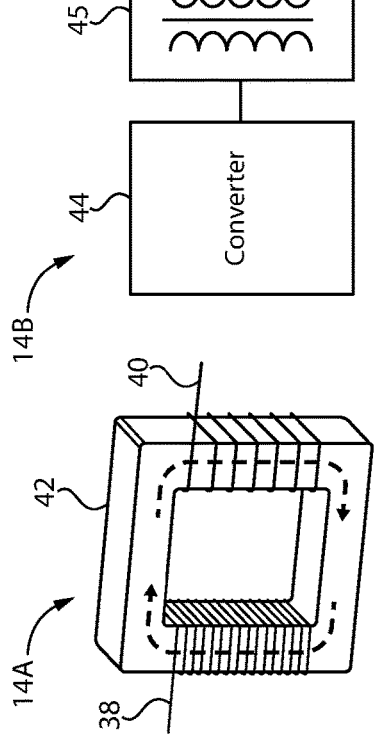
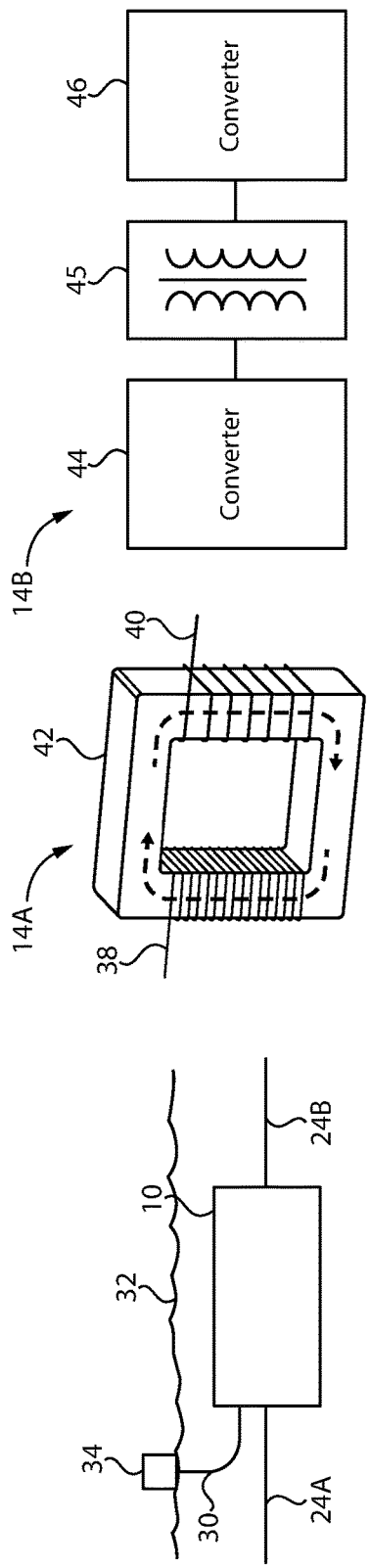

SOLID STATE PREFABRICATED SUBSTATION

BACKGROUND

The present inventions relate generally to electrical substations, and more particularly, to a substation with a solid state breaker.

Substations are used throughout the electrical grid to change the voltage of the electrical power supply and to stop current flow to portions of the grid in the event of a fault. Primary substations are large facilities that must be secured with fencing to protect people from the high voltages transmitted through the substation. However, this requires large spaces that must be set aside for a primary substation and limits the number of places where such substations can be located. Secondary substations are smaller and are sometimes located in urban areas. Such substations typically satisfy the IEC 62271-202 standard for prefabricated substations and are housed in an above-ground enclosure that allows access to the internal components for maintenance. Thus, there are also constraints when locating secondary substations.

Another limitation of current substations is that operators must be able to access the substation to perform maintenance of the components in the substation. This presents a risk to the operator and can require additional downtime of the substation to perform maintenance. The need for maintenance access also limits where the substation can be located and the design of the substation. One particular area where maintenance is needed is the breaker(s) for the substation. A breaker is used to stop electrical current flow through the substation when an electrical fault occurs. Typically, breakers are mechanical units with physical contacts that separate from each other when a fault current is sensed. During separation of the physical contacts, a high current arc can occur between the contacts until the contacts separate far enough to extinguish the arc. While mechanical breakers of this type are useful in interrupting fault currents, repeated breaker operations and resulting arcs can wear the contacts. Thus, mechanical breakers require periodic maintenance and access to the substation.

Accordingly, the inventors believe a substation that requires less maintenance and can be placed in more locations would be desirable.

SUMMARY

A prefabricated substation is described for reduced maintenance. Unlike conventional substations that use mechanical breakers to interrupt faults, the improved substation uses a solid state breaker to interrupt faults. Due to the reduced maintenance of the substation, the primary components of the substation may be arranged compactly within a housing. As a result, the substation may be located closer to or within urban areas where it is currently difficult to locate conventional substations. It is also possible that the substation may be buried underground to provide even greater flexibility in locating the substation. The inventions may also include any other aspect described below in the written description or in the attached drawings and any combinations thereof.

BRIEF DESCRIPTION OF SEVERAL VIEWS OF THE DRAWINGS

The invention may be more fully understood by reading the following description in conjunction with the drawings, in which:

FIG. 1 is a schematic view of a prefabricated substation;

FIG. 2 is a schematic of the substation buried underground;

FIG. 3 is a schematic of a low frequency transformer;

FIG. 4 is a schematic of a high frequency transformer;

DETAILED DESCRIPTION

Figure 5:
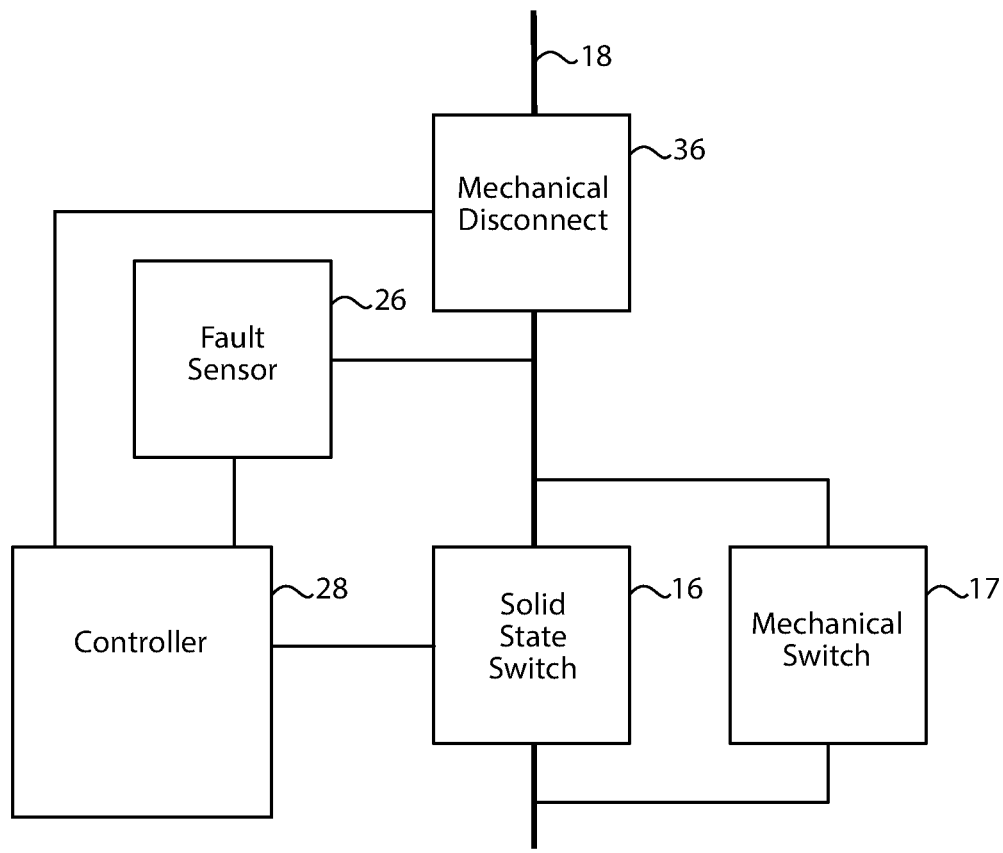
FIG. 5 is a schematic of components of the substation.

Referring now to the figures, and particularly FIG. 1, a prefabricated substation 10 is shown. Preferably, the substation is a secondary prefabricated substation that satisfies the IEC 62271-202 standard (e.g., Ed. 2.0 2014-03). As shown, the major components of the substation 10 are enclosed within a housing 12. That is, the substation 10 includes a transformer 14 for transforming the input voltage to an output voltage. The substation 10 also includes one or more breakers 16 for interrupting current flow between the input 18 and output 20 when a fault occurs. Thus, the housing 12 encloses at least the transformer 14 and the breaker 16. The input 18 and output 20 of the substation 10 are each provided with electrical connectors 22 to connect incoming 24A and outgoing 24B electrical cables. In the preferred substation, the input voltage of the incoming cables 24A is a medium voltage between 1 kV and 72 kV. The transformer 14 then transforms the input voltage to a low voltage up to 1,000V, which is supplied to the outgoing cables 24B. It is understood that while FIG. 1 is shown in a single AC phase arrangement, the housing 12 could have multiple transformers 14 and/or breakers 16 to operate in a three-phase AC system if desired and may also be used in a DC arrangement.

Unlike conventional substations, the breaker 16 in the substation 10 is a solid state switch 16 without physical contacts as in mechanical breakers. Since the general technology of solid state switches is well known, it is unnecessary to describe the detailed structure of such switches. As an example, the solid state switch 16 may use various types of semiconductors to switch power on and off through the solid state switch 16, including an integrated gate-commutated thyristor (IGCT), reverse blocking integrated gate-commutated thyristor (RB-IGCT), gate turn-off thyristor (GTO), insulated-gate bipolar transistor (IGBT), or field-effect transistor (FET). The solid state switch is preferably a semiconductor switching device capable of switching currents in the kilovolt range made of silicon, silicon carbide or gallium nitride. As illustrated in FIG. 5, it is also possible to provide a mechanical breaker 17 in parallel with the solid state breaker 16. In this alternative, the mechanical breaker 17 will experience much less current flow and arcing during a fault compared to conventional systems where a mechanical breaker is the primary breaker. Thus, the mechanical breaker 17 in this hybrid system will have a significantly higher lifespan without the need for regular maintenance. As also shown in FIG. 5, the substation 10 also includes a fault sensor 26 that measures an electrical property of the electrical power supply and/or demand, such as changes in voltage or current. Although it is possible for the fault sensor 26 to be located outside of the housing 12 and measure the electrical property in one or both of the cables 24 or elsewhere, it is preferable for the fault sensor 26 to be located within the housing 12 and to measure the electrical property between the input 18 and output 20. More preferably, fault sensors 26 may be incorporated into the solid state switches 16. The substation 10 is also provided with a controller 28 connected between the fault sensor 26 and the solid state switch 16. The controller 28 monitors the fault sensor 26, and when the controller 28 receives a signal from the fault sensor 26 indicating that a fault has occurred based on measurements of the electrical property, the controller 28 sends a signal to the solid state switch 16 to open and break current flow between the input 18 and output 20. It is understood that a voltage clamping device to manage voltage spikes when opening the solid state switch 16 may also be provided, such as a metal oxide varistor (MOV), a snubber circuit (RC, RCD) or a diode (TVS, breakdown, zener). Like the fault sensor 26, it is possible that the controller 28 could be located outside of the housing 12, but it is preferable for the controller 28 to be located within the housing 12 with the fault sensor 26, breaker 16 and transformer 14. More preferably, a controller 28 may be incorporated into each of the solid state switches 16.

The use of a solid state switch 16 to break current flow in the event of a fault as opposed to a mechanical breaker has the potential to significantly reduce maintenance requirements and access to the substation 10. The use of a solid state switch as opposed to a mechanical breaker may also reduce the safety radius needed due to the elimination of or reduced size of arc flashes during breaker operations. Also, the substation 10 may be significantly smaller in overall size since the components in the housing 12 can be packed tighter since regular access and maintenance may not be needed. The use of a solid state transformer 14B may reduce the overall size of the substation 10 further. One advantage of the substation 10 is that it may be prefabricated as an assembled unit that is shipped to the installation site without requiring extensive assembly onsite. As shown in FIG. 2, one advantage of this arrangement is that it may be possible to bury the substation 10 underground such that the housing 12 is completely covered by earth. This may allow the substation 10 to be placed in locations that would be prohibitive with conventional substations. For instance, the substation 10 could be buried underground in urban or rural areas and may provide greater flexibility in locating the substation 10 in urban areas. That is, by burying the substation 10, concerns about people coming into contact with the high-voltage components of the substation 10 could be avoided. The space constraints could also be alleviated since the substation 10 may be more compact than conventional substations and the ground above the substation 10 could be used for other purposes. Thus, the substation 10 can increase safety, improve land utilization, allow additional grid design flexibility and reduce maintenance expenses.

Since the substation 10 may be buried and not regularly accessed for maintenance, it may be preferable for the housing 12 to be sealed and not provided with any access openings. As shown in FIG. 2, it may also be desirable to provide the substation 10 with a communication line 30 to permit communication (including control) with the substation 10 from outside of the substation 10. For example, the communication line 30 may extend through the housing 12 to connect to the controller 28. The communication line 30 may then extend to the ground surface 32 to a communications port or interface 34 or may be connected to a centralized management system. It is understood that the communication port 34 may also be within the substation 10 and the communication line 30 may extend from the substation 10 to the ground surface 32. Thus, the communication line 30 may allow remote operation of the substation 10, monitoring of substation performance, etc.

As shown in FIG. 5, it may be desirable to also provide the substation 10 with a mechanical disconnect 36. Importantly, the mechanical disconnect 36 is not used to break current flow when a fault is sensed by the fault sensor 26. As described above, the solid state switch 16 is the primary component that breaks current flow in response to a fault. Instead, the mechanical disconnect 36 may be used as a secondary system control. For example, when a fault occurs, the controller 28 will initially open the solid state switch 16 to break the current flow through the substation 10. After the solid state switch 16 has been opened and the current flow has been broken, the controller 28 may then send a signal to the mechanical disconnect 36 to open its physical contacts. In this arrangement, current is not flowing through the disconnect 36 when it is opened (unlike a mechanical breaker), and thus, no current arc will occur between the physical contacts and maintenance issues will be less of a concern. Like the fault sensor 26 and controller 28, the mechanical disconnect 36 may be located outside of the housing 12, but it may be desirable to have the disconnect 36 within the housing 12.

Although it may be possible for a single solid state breaker 16 to be used in the substation (e.g., for each phase), it may also be desirable to have one solid state breaker 16A on the medium voltage side and another solid state breaker 16B on the low voltage side as shown in FIG. 1. That is, one breaker 16A may be located between the input 18 and the transformer 14 and another breaker 16B may be located between the transformer 14 and the output 20. In this arrangement, it may be desirable for both breakers 16A, B to be opened when a fault is sensed.

Turning to FIGS. 3-4, the transformer 14 may be either a conventional low frequency transformer 14A or a solid state high frequency transformer 14B. As shown in FIG. 3, low frequency transformers 14A have a primary coil 38, a secondary coil 40 and a core 42 therebetween. The primary coil 38 is connected to the input 18 and the secondary coil 40 is connected to the output 20. Thus, the transformer 14A converts the input AC voltage to a lower output AC voltage in a conventional fashion. Alternatively, as shown in FIG. 4, the transformer 14B may be a high frequency transformer 14B that includes an input converter 44, an output converter 46 and a transformer 45 therebetween. The input and output converters utilize power semiconductor switches to convert the voltage, current and/or frequency of the electricity flowing therethrough with high frequency switching operations. The transformer 45 may also utilize power semiconductor switches to step down the voltage if desired. The input converter 44 is connected to the input 18 and the output converter 46 is connected to the output 20. Since a high frequency transformer 14B does not need large windings and a large core like a conventional low frequency transformer 14A, a high frequency transformer 14B may be significantly smaller in size. This may be particularly advantageous in the present substation 10 to minimize the overall size of the substation 10. It is understood that other types of solid state transformers may also be used in the substation 10.

Figure 6:
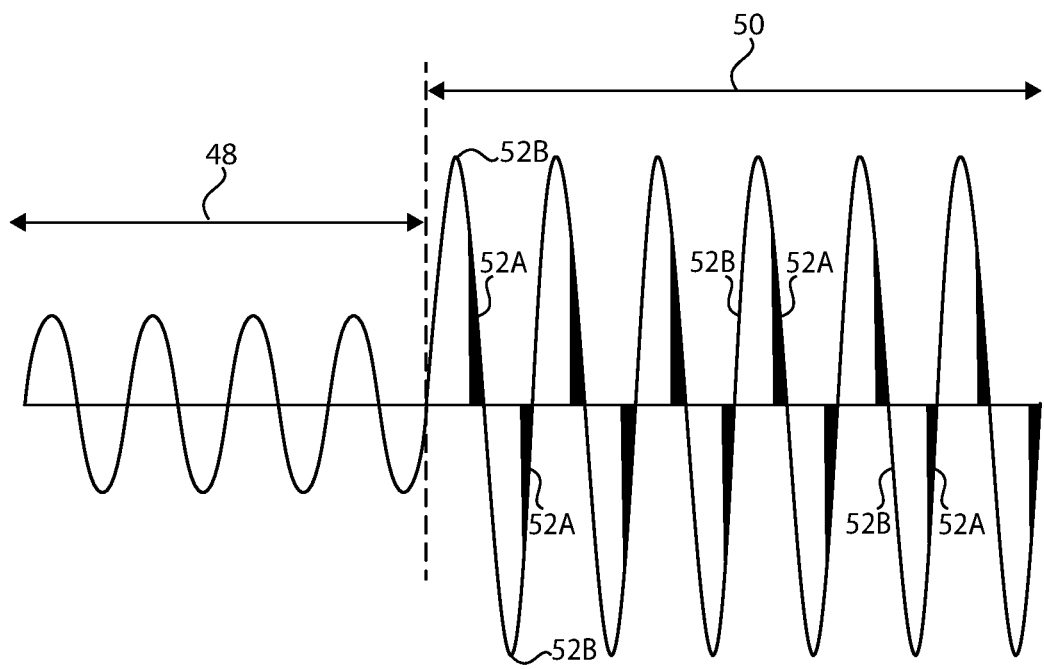
FIG. 6 is a chart showing current limiting of fault conditions.

Turning to FIG. 6, it may also be possible to limit current flow through the substation 10 in the event of fault conditions prior to breaking the current flow through the substation 10. As shown, during normal operation 48 current flow stays within a defined range. However, when fault conditions 50 occur, current increases beyond the normal range. Instead of immediately breaking the current flow, it may be desirable to limit current flow through the substation 10 for a period of time in case the fault condition 50 is temporary and not a permanent fault that requires a complete break in the current flow. Because solid state switches 16 may be switched on and off at very high speeds (i.e., faster than the AC frequency), the breaker 16 may switch on 52A and off 52B for a period of time to allow part 52A of the electrical cycles to pass through to the output 20 while opening and interrupting part 52B of the electrical cycles. In this case, the high current and/or high voltage portions of the electrical cycles may be interrupted. In the case that the controller 28 determines that a permanent fault has occurred after temporarily limiting 50 current flow, the controller 28 may then leave the breaker 16 open to completely interrupt current flow. Alternatively, where the transformer 14 is a high frequency transformer 14B that uses semiconductor switches, it may be possible to use the switches in the transformer 14B to limit current flow and to use the solid state breaker 16 to completely interrupt current flow after first limiting current flow with the transformer 14B. It may also be possible to integrate the solid state transformer 14B and the solid state switches 16 together in a single unit.

It is expected that heat will be generated within the housing 12 of the substation 10 due to the electrical components therein. Thus, it may be desirable to provide a heat transfer arrangement to cool the electrical components. In particular, the solid state breaker 16 and the transformer 14 may be significant sources of heat generation. One way to dissipate heat is to transfer heat out through one or more walls of the housing 12. This may be particularly useful where the substation 10 is buried underground since the heat generated in the substation 10 may be absorbed by the ground which will be at a generally constant, relatively low temperature. Therefore, it may be useful for at least a portion of the housing 12 to be made of metal to dissipate heat to the outside of the substation 10. In one embodiment, the entire housing 12, including the top, bottom and side walls of the housing 12 may be made of metal. The breaker 16 and/or the transformer 14 may then be in thermal contact with a metal portion of the housing 12 on the inside of the housing 12. The metal portion may also be exposed to the exterior of the housing 12 to convey heat from the breaker 16 and transformer 14 to the outside of the substation 10 (e.g., to the surrounding earth). In addition, it may be desirable to include a heat exchanger 54 within the housing 12 to absorb heat from within the housing 12 (e.g., the breaker 16 and transformer 14) and dissipate heat out of the housing 12 in a similar manner through the housing wall. As shown in FIG. 1, the heat exchanger 54 may be located between the breaker 16 and the transformer 14 so that the heat exchanger 54 is in thermal contact with the breaker 16 and/or transformer 14.

It may also be desirable to fill the housing 12 with a filler material 56. The filler material 56 may serve various purposes. For example, as described above, it may be desirable to dissipate heat out of the substation 10 through the walls of the housing 12. For this reason, it may be desirable to fill the housing 12 with a thermally conductive material like oil, conductive epoxy or another material with a thermal conductivity of at least 100 mW/(m·K) or at least 1,000 mW/(m·K). Thus, in this arrangement, heat generated by the electrical components in the housing 12 may be absorbed directly by the filler material 56 in contact therewith and transferred out through the housing walls which the filler material 56 is also in contact with. The filler material 56 may also be used to provide additional structural integrity to the substation 10 (e.g., to resist outside pressure against the housing 12 walls) or to provide additional sealing protection to the internal components against any possible exterior leakage into the housing 12. For these reasons, it may be desirable to fill the housing 12 with a filler material 56 that has a density of at least 500 kg/m³. Where structural support is desired of the filler material 56, it may be preferred for the filler material to be a non-fluid solid. Although it may be desirable to completely fill the empty space in the housing with the filler material 56, it is also possible to only fill the sides if desired.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. An electrical substation, comprising:
  a housing comprising an input and an output;
  a transformer between the input and the output and transforming a first voltage of the input to a second voltage of the output, the first voltage being higher than the second voltage;
  a solid state switch between the input and the output;
  a fault sensor incorporated into the solid state switch, the fault sensor measuring an electrical property between the input and the output; and
  a controller configured to send a signal to the solid state switch to open the solid state switch and break current flow between the input and the output based upon a measurement of the fault sensor indicating a fault of the electrical property between the input and the output;
  wherein the housing encloses the transformer and the solid state switch.

2. The electrical substation according to claim 1, wherein the solid state switch is an integrated gate-commutated thyristor (IGCT), reverse blocking integrated gate-commutated thyristor (RB-IGCT), gate turn-off thyristor (GTO), insulated-gate bipolar transistor (IGBT), or field-effect transistor (FET).

3. The electrical substation according to claim 1, wherein the first voltage is between 1 kV and 72 kV and the second voltage is 1,000V or less.

4. The electrical substation according to claim 1, further comprising a heat exchanger, the heat exchanger being in thermal contact with the solid state switch.

5. The electrical substation according to claim 1, wherein the housing comprises at least a metallic portion in thermal contact with the solid state switch and exposed to an exterior of the housing.

6. The electrical substation according to claim 1, wherein a top, a bottom, and side walls of the housing are made of metal.

7. The electrical substation according to claim 1, wherein a filler material surrounds a side and/or a top of the solid state switch and a side and/or a top of the transformer, the filler material contacting one or more walls of the housing and having a thermal conductivity of at least 100 mW/(m–K).

8. The electrical substation according to claim 7, wherein the filler material has a thermal conductivity of at least 1,000 mW/(m·K).

9. The electrical substation according to claim 1, wherein a filler material surrounds a side and/or a top of the solid state switch and a side and/or a top of the transformer, the filler material contacting one or more walls of the housing, the filler material having a density of at least 500 kg/m$^3$.

10. The electrical substation according to claim 1, wherein the housing encloses the controller.

11. The electrical substation according to claim 1, further comprising a communication line connected to the controller and extending through the housing for external communication with the controller.

12. The electrical substation according to claim 1, wherein the transformer is a low frequency transformer comprising a primary winding connected to the input, a secondary winding connected to the output and a core therebetween.

13. The electrical substation according to claim 1, wherein the transformer is a high frequency transformer comprising an input converter and an output converter, the input and output converters configured to convert voltage with semiconductor switches and without primary and secondary windings.

14. The electrical substation according to claim 13, wherein the high frequency transformer limits current flow between the input and the output in response to the fault sensor before the solid state switch is opened to break current flow between the input and the output.

15. The electrical substation according to claim 1, wherein the solid state switch limits current flow between the input and the output in response to the fault sensor indicating the fault of the electrical property between the input and the output by opening for part of a plurality of electrical cycles of the electrical substation before remaining open to break current flow between the input and the output.

16. The electrical substation according to claim 1, further comprising:
a mechanical disconnect switch, the controller configured to send a signal to open the mechanical disconnect switch after the solid state switch has opened and broken current flow between the input and the output.

17. The electrical substation according to claim 16, wherein the housing encloses the mechanical disconnect switch.

18. The electrical substation according to claim 1, wherein the solid state switch is a plurality of solid state switches, the plurality of solid state switches comprise a first one of the solid state switches between the input and the transformer and a second one of the solid state switches between the transformer and the output, the controller opening both the first and second solid state switches in response to the fault sensor indicating the fault of the electrical property between the input and the output.

19. The electrical substation according to claim 1, wherein the housing is sealed and includes no access openings.

20. The electrical substation according to claim 1, wherein the solid state switch is configured to break the entire current flow in response to the fault of the electrical property between the input and the output without a mechanical breaker being in the electrical substation.

21. The electrical substation according to claim 1, further comprising in response to the fault of the electrical property between the input and the output, a mechanical breaker in parallel with the solid state switch, the mechanical breaker configured to break a portion of the current flow between the input and the output and the solid state switch configured to break another portion of the current flow between the input and the output.

22. An underground electrical substation, wherein the housing of the electrical substation according to claim 1 is completely buried underground.

23. An electrical substation, comprising:
a housing comprising an input and an output;
a transformer between the input and the output and transforming a first voltage of the input to a second voltage of the output, the first voltage being higher than the second voltage;
a first solid state switch between the input and the transformer;
a second solid state switch between the transformer and the output;
a first fault sensor measuring an electrical property of the first solid state switch;
a second fault sensor measuring an electrical property of the second solid state switch; and
a controller configured to send a signal to the first solid state switch to open the first solid state switch and break current flow between the input and the transformer based upon a measurement of the first fault sensor indicating a fault of the electrical property of the first solid state switch, and the controller configured to send a signal to the second solid state switch to open the second solid state switch and break current flow between the transformer and the output based upon a measurement of the second fault sensor indicating a fault of the electrical property of the second solid state switch;
wherein the housing encloses the transformer and each of the first and second solid state switches.

* * * * *